(12) United States Patent
Boulanger

(10) Patent No.: US 6,903,260 B2
(45) Date of Patent: Jun. 7, 2005

(54) SOLAR PANEL HAVING ELECTRICAL TERMINALS DISTRIBUTED ACROSS THE SURFACE THEREOF

(75) Inventor: Bernard Boulanger, Roquebrune sur Argens (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/472,041

(22) PCT Filed: Feb. 18, 2002

(86) PCT No.: PCT/FR02/00611

§ 371 (c)(1),
(2), (4) Date: Sep. 17, 2003

(87) PCT Pub. No.: WO02/074623

PCT Pub. Date: Sep. 26, 2002

(65) Prior Publication Data

US 2004/0112419 A1 Jun. 17, 2004

(30) Foreign Application Priority Data

Mar. 21, 2001  (FR) .......................................... 01 03822

(51) Int. Cl.⁷ .......................... B64G 1/44; H01L 31/042
(52) U.S. Cl. ...................... 136/244; 136/291; 136/293; 244/173; 257/443
(58) Field of Search ................................ 136/244, 291, 136/292, 293; 244/173; 257/443

(56) References Cited

U.S. PATENT DOCUMENTS

| 3,819,417 | A | * | 6/1974 | Haynos ....................... 136/244 |
| 4,409,537 | A | * | 10/1983 | Harris ......................... 136/244 |
| 6,543,725 | B1 | * | 4/2003 | Meurer et al. ............... 244/173 |

FOREIGN PATENT DOCUMENTS

| DE | 19836272 A1 | | 2/2000 |
| JP | 61-4266 A | * | 1/1986 |
| JP | 03104174 A | | 5/1991 |
| JP | 06275857 A | | 9/1994 |

* cited by examiner

*Primary Examiner*—Alan Diamond
(74) *Attorney, Agent, or Firm*—Sughrue Mion, PLLC

(57) ABSTRACT

The solar panel for space satellites has a plane surface including a plurality of photovoltaic cells (CE) disposed side-by-side and substantially forming a grid, the cells (CE) being electrically connected into at least one serpentine (SE1), each serpentine made up of cells (CE) connected in series two-by-two forming parallel cell segments (SG), two successive segments (SG) of a serpentine being electrically connected at their ends, and each serpentine having positive terminals (+) and negative terminals (−), the positive (+) and negative (−) terminals being distributed along each serpentine (SE1) and over the surface of the panel so that the positive terminals are far away from the negative terminals, to reduce the risk of electrical arcing between two terminals. With this arrangement, the risk of electrical arcing is reduced without increasing the fabrication cost of the panel.

5 Claims, 6 Drawing Sheets

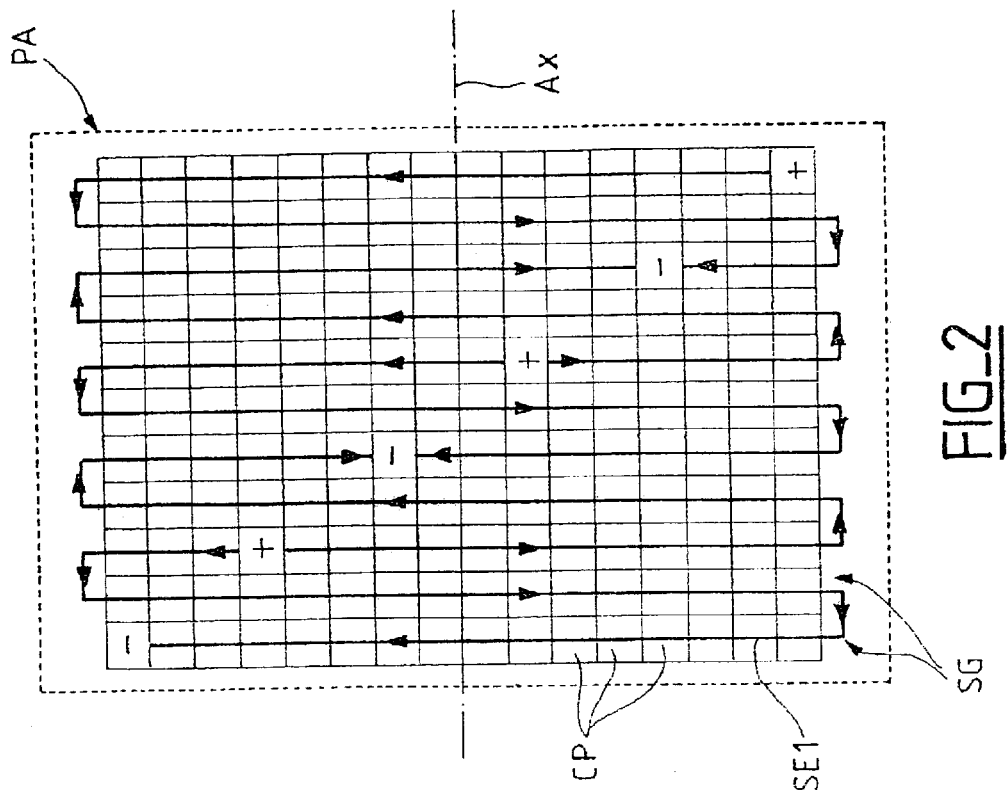
FIG_2
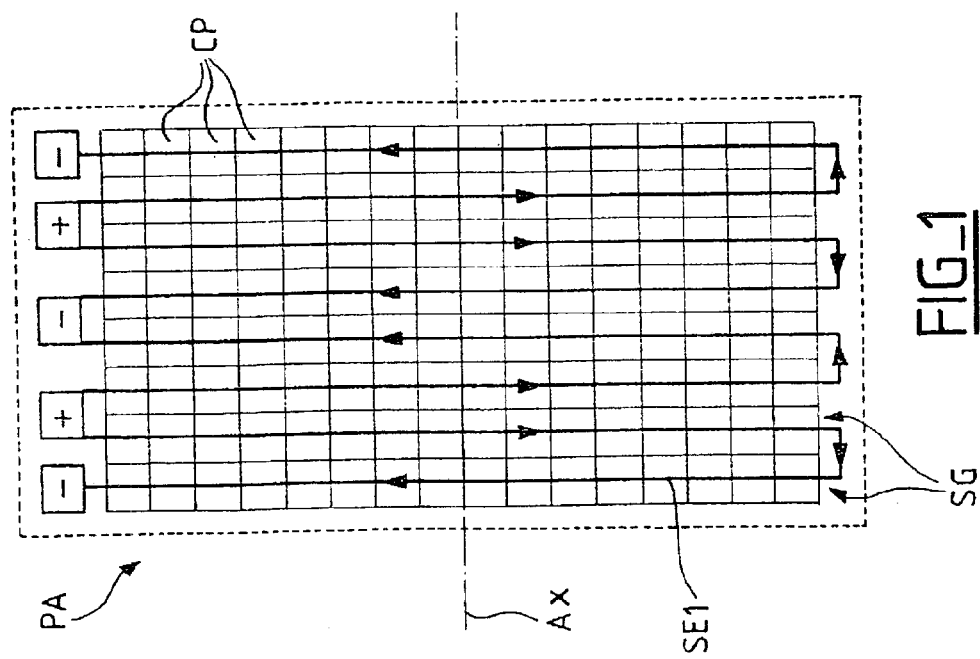
FIG_1
PRIOR ART

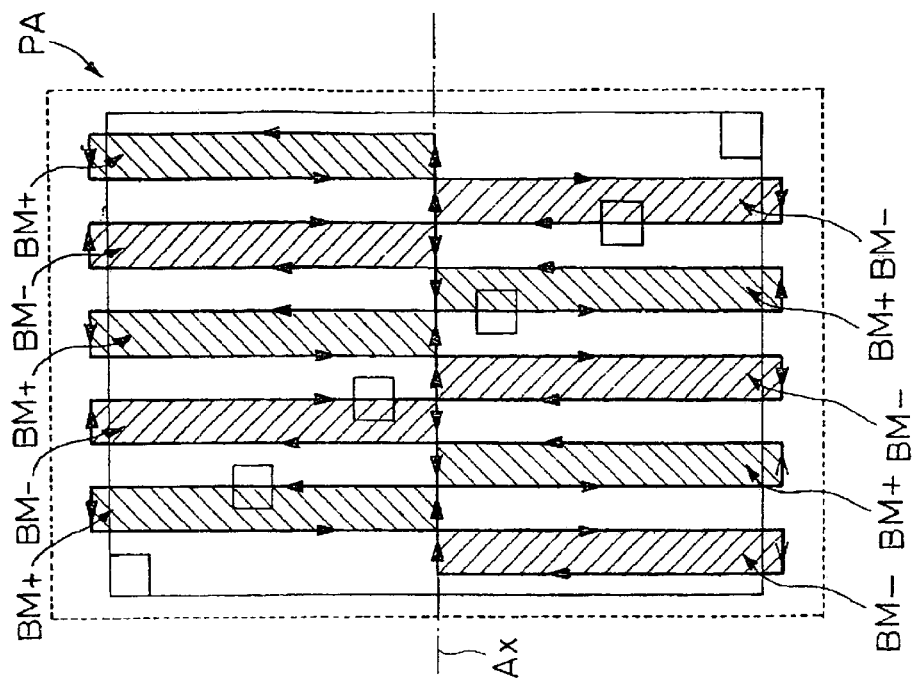
FIG_4
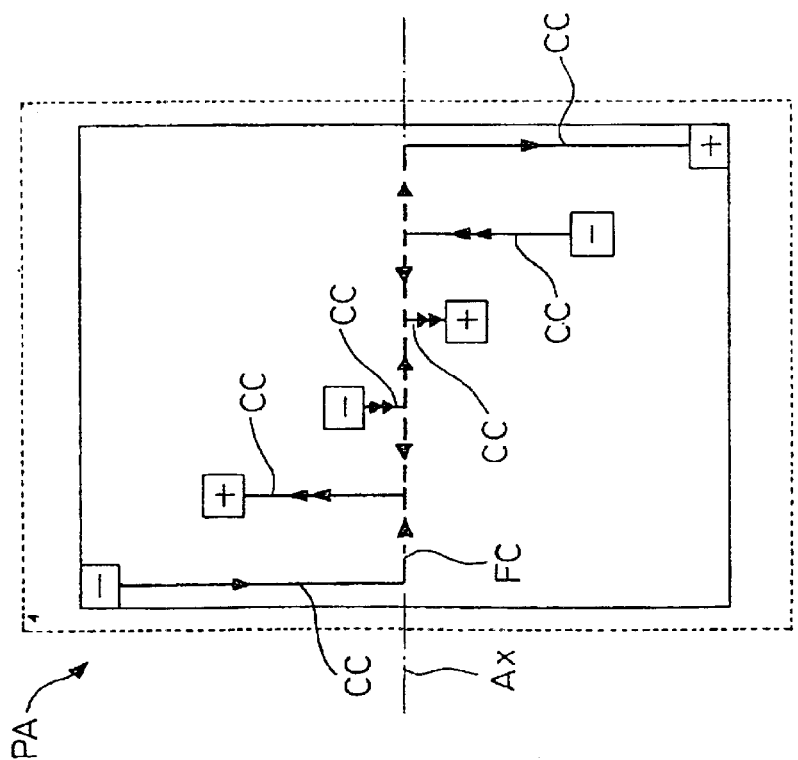
FIG_3

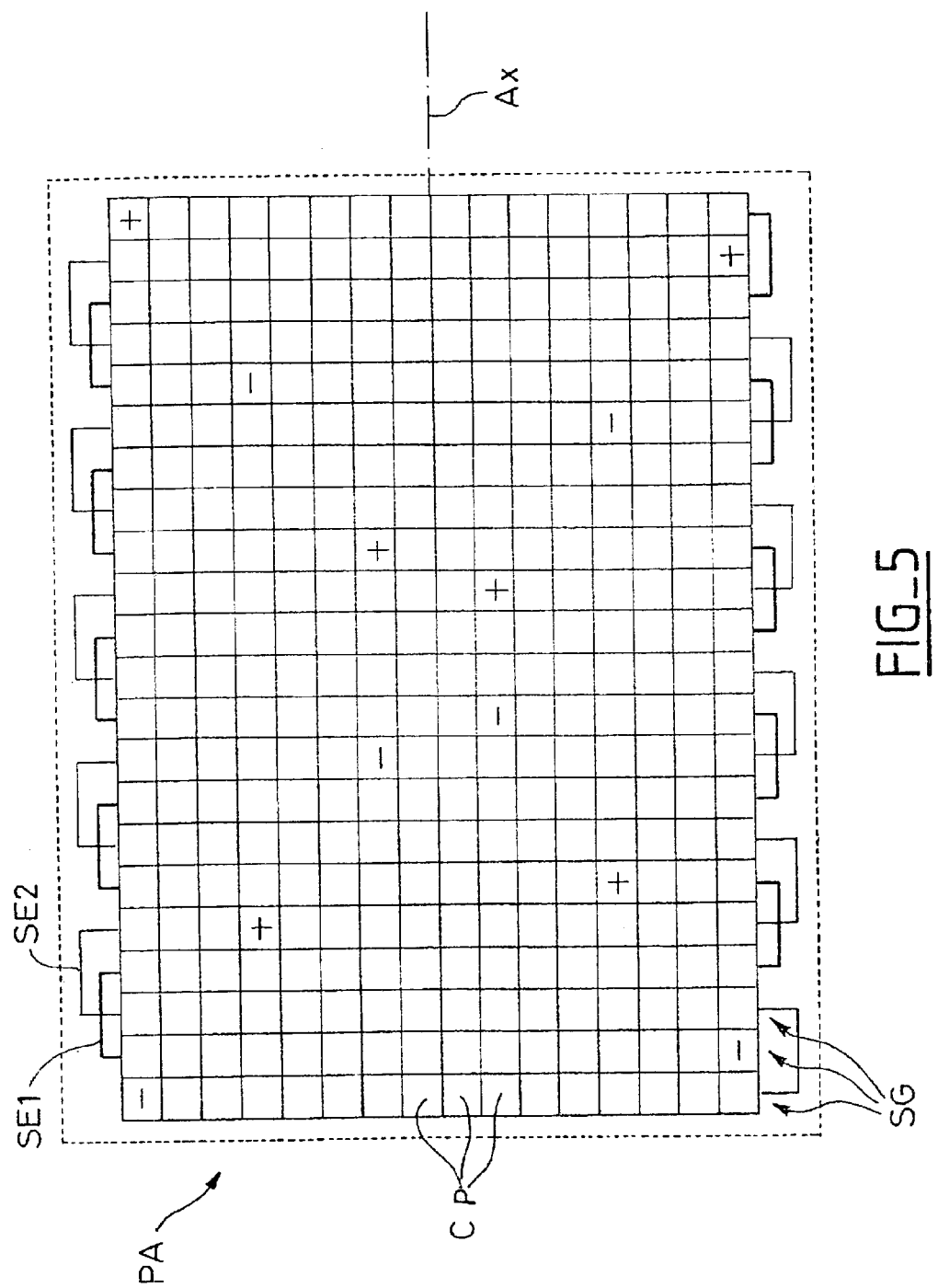
FIG_5

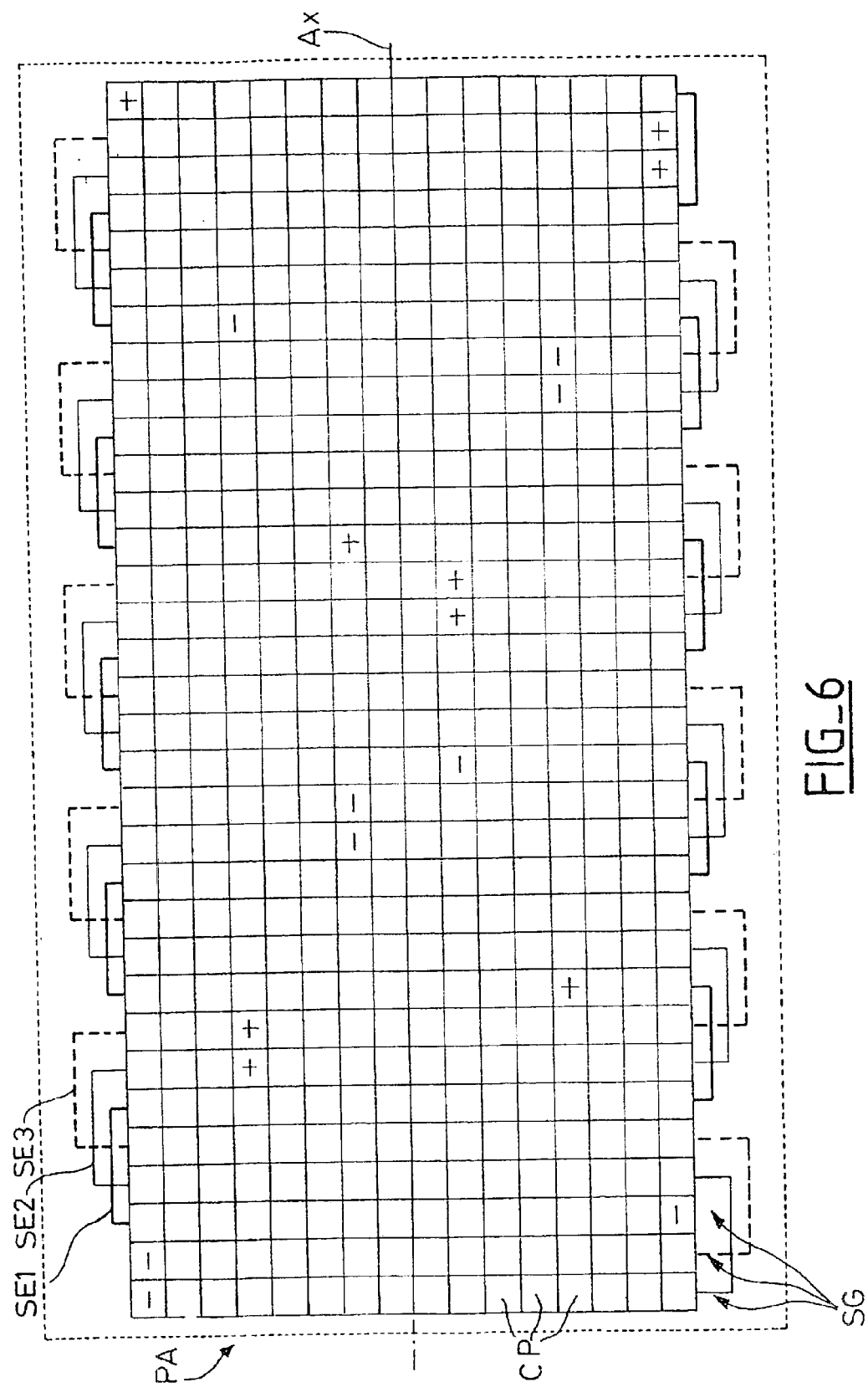
FIG_6

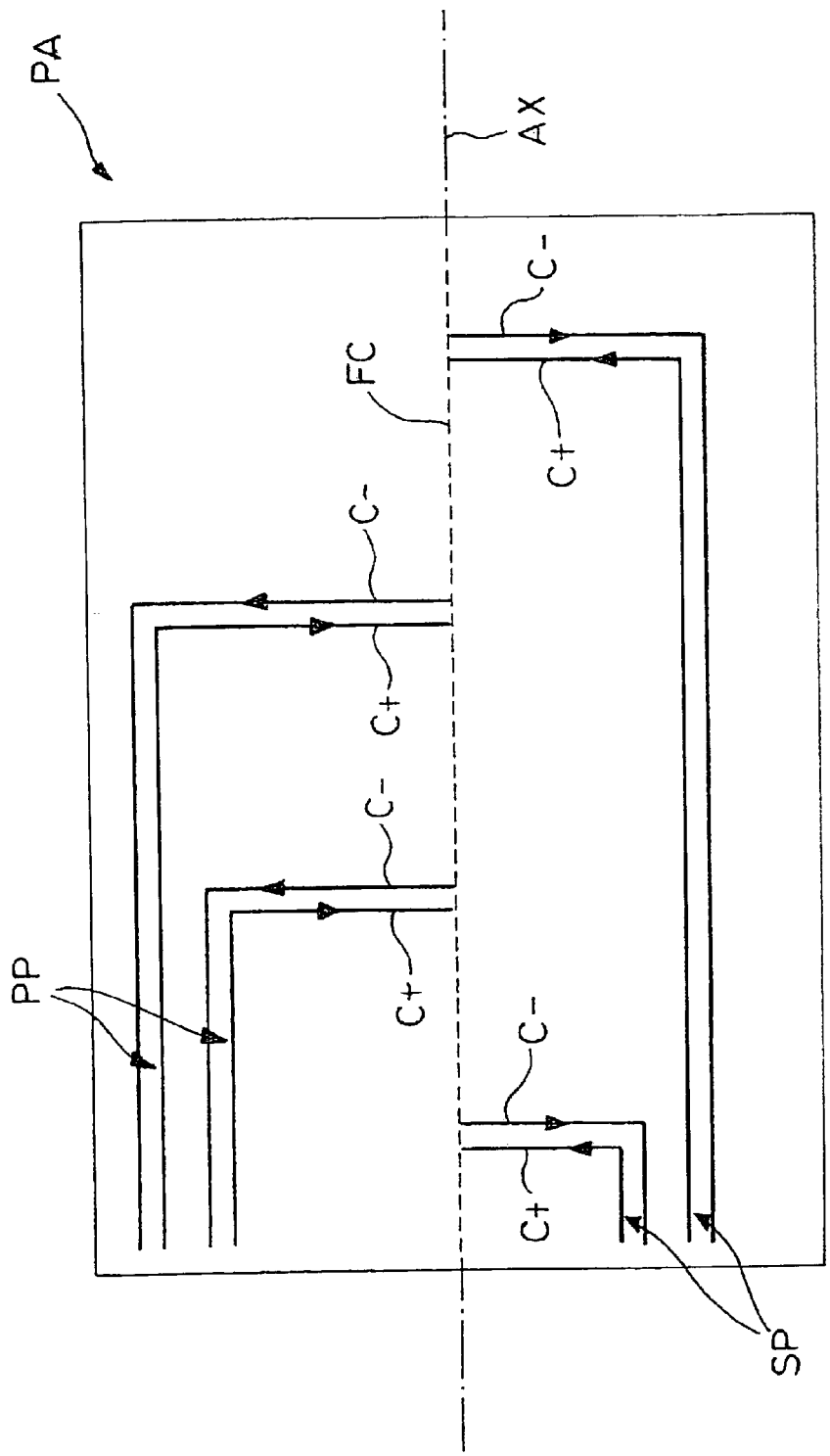
FIG_7

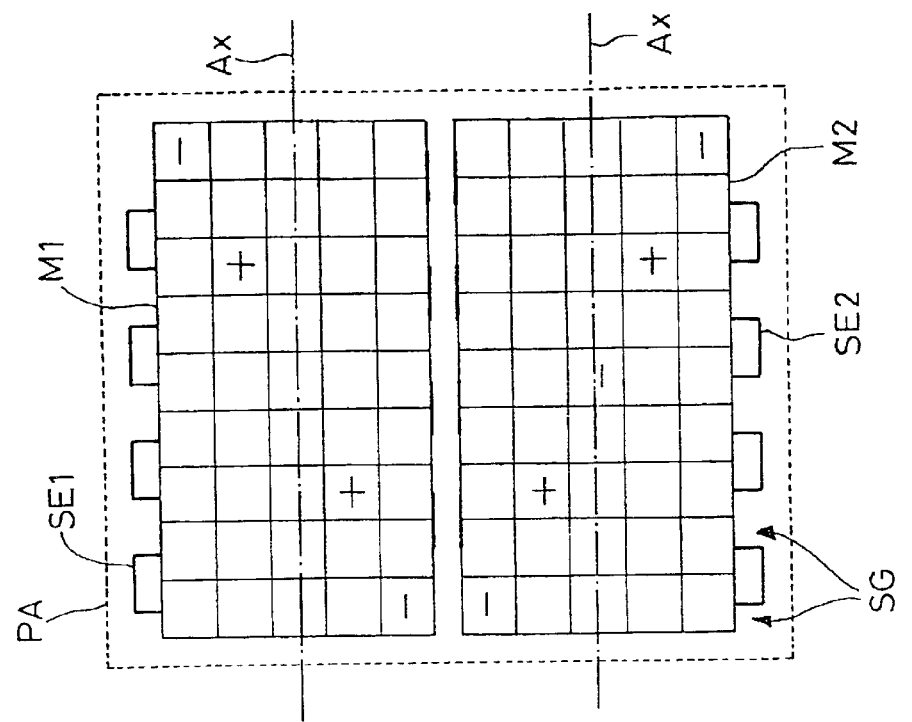
FIG_9
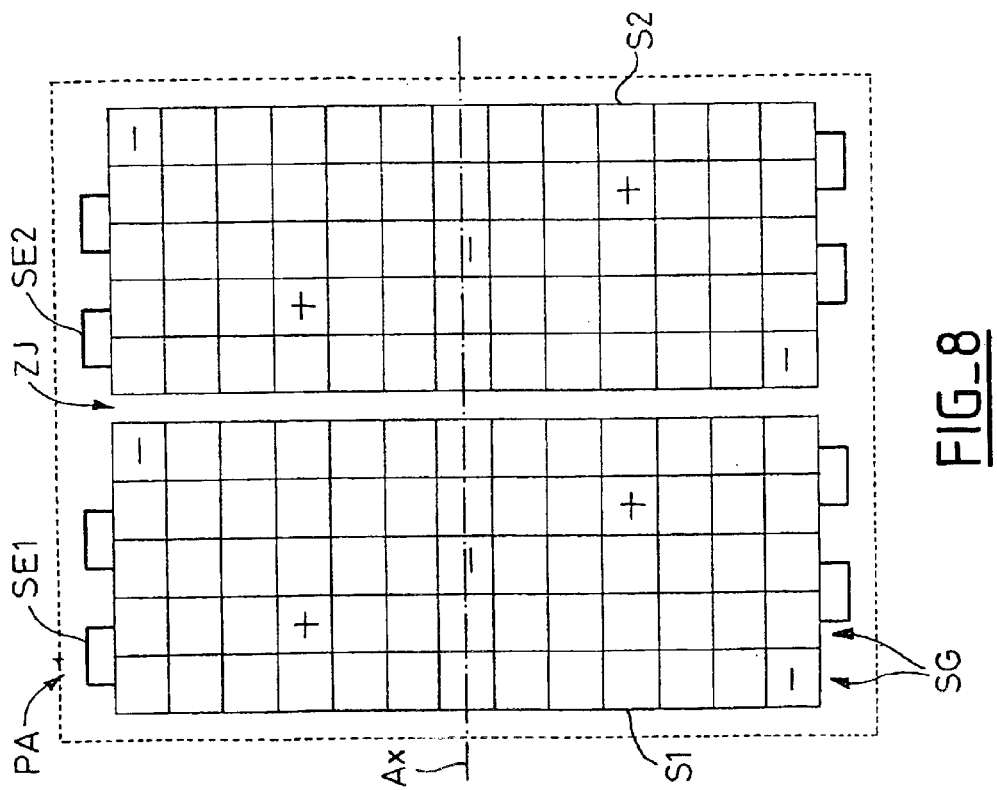
FIG_8

SOLAR PANEL HAVING ELECTRICAL TERMINALS DISTRIBUTED ACROSS THE SURFACE THEREOF

BACKGROUND OF THE INVENTION

The invention relates to a solar panel for space satellites, having a plane surface comprising a plurality of photovoltaic cells disposed side by side and substantially forming a grid, said cells being electrically connected into at least one serpentine, each serpentine comprising cells connected in series two by two forming parallel cell segments, two successive segments of a serpentine being electrically connected at their ends, and each serpentine comprising positive terminals and negative terminals.

The invention applies more particularly to the field of plane photovoltaic panels equipping satellites encountering a severe electrostatic environment, such as geosynchronous satellites, in which the photovoltaic cells are mounted on a substrate, for example. In a panel of this kind disclosed in the patent EP 0 938 141, the cells are connected to form U-shaped serpentines. Each serpentine has positive and negative terminals at its ends situated at an edge of the panel and the current produced by the serpentine is conveyed in the direction of the satellite by electrical cables. In these prior art panels, the positive and negative terminals that are contiguous have a high potential difference and carry a high current. The existence of these terminals a small distance apart and having a high potential difference encourages continuous electrical arcing between the terminals or between cells close to the terminals. This electrical arcing causes pyrolysis of the substrate and leads to irreversible short circuiting of the section consisting of the cells connected between the two short circuit points. More generally, arcing can occur between two adjacent cells of the panel which have a high potential difference. This phenomenon occurs as a consequence of the occurrence of a primary arc that is formed as a result of electrostatic charging of the insulative panel surface (cover glass), the primary arc being sufficient to strike a continuous arc.

The patent EP 0 938 141 discloses placing an insulative material between adjacent cells to block the path between cells, referred to as the gap, to the primary arcs. Secondly, to reduce the consequences of a short circuit, diodes are associated with the photovoltaic cells to reduce the short circuit current to the current supplied by only one section of cells. These two methods are not entirely satisfactory in that they tend in particular to add to the weight of the panel, which penalizes the electrical power/mass ratio. Secondly, these two methods require made-to-measure cells, which increases the fabrication cost of this kind of panel.

SUMMARY OF THE INVENTION

The object of the invention is to remedy these drawbacks by proposing an arrangement of cells and a form of wiring that significantly reduce the risks of short circuits in the above kind of solar panel.

To this end, the invention provides a solar panel for space satellites, having a plane surface comprising a plurality of photovoltaic cells disposed side-by-side and substantially forming a grid, said cells being electrically connected into at least one serpentine, each serpentine comprising cells connected in series two-by-two forming parallel cell segments, two successive segments of a serpentine being electrically connected at their ends, and each serpentine comprising positive terminals and negative terminals, said positive and negative terminals being distributed along each serpentine and over the surface of the panel so that the positive terminals are far away from the negative terminals, to reduce the risk of electrical arcing between two terminals; said panel comprising a plurality of serpentines interlaced and arranged substantially symmetrically with respect to an axis of the panel, said axis being perpendicular to said segments, and two contiguous segments of the panel belonging to two different serpentines, which solar panel is characterized in that the direction of the current is reversed starting from the first pair of contiguous segments so that each pair of contiguous cells has a potential difference less than the voltage drop of a segment of cells, in order to reduce the risk of electrical arcing between contiguous cells. With this arrangement, the potential difference between adjacent cells of the panel is further reduced, to reduce the probability of short circuits.

With this kind of construction the distances between terminals having a high potential difference are increased and a panel can be constructed from cells of standard size, which significantly reduces the fabrication cost.

In another particular embodiment of the invention, the panel comprises cables each departing from a terminal of the panel and extending parallel to the segments as far as an axis of the panel and then running along said axis, forming a bundle of cables, to form with each serpentine current loops generating magnetic moments that cancel each other out. With this arrangement, the magnetic moment applied to the panel by each serpentine is substantially zero.

In a further particular embodiment, the panel comprises pairs of flat cables or cables mounted flat to recover a current supplied by the panel and direct it toward an edge of the panel, each cable pair comprising a positive cable and a negative cable, said pairs comprising first cable pairs departing from said bundle and extending over a first half of the panel relative to an axis and second cable pairs departing from the bundle and extending over a second half of the panel relative to the axis, and said first cable pairs having a cumulative length substantially identical to that of the second cable pairs to generate magnetic moments that cancel each other. With this arrangement, the magnetic moment applied to the panel by the various cable pairs is substantially zero.

In another particular embodiment, the panel has at least two consecutive sections disposed along the axis, each section being electrically independent and comprising at least one serpentine constituted of a plurality of segments, and in which solar panel two contiguous segments belonging to two consecutive sections each comprise a negative terminal, so that two contiguous cells belonging to two different sections have a reduced potential difference if one of said sections is electrically deactivated. With this arrangement, a power manager of the satellite can deactivate some sections of the panel without risk of electrical arcing.

In another particular embodiment, the panel comprises at least two modules, each module comprising at least one serpentine constituted of segments, and two contiguous modules are disposed facing each other, so that the ends of their segments are contiguous, so that said segments have a reduced length in order to reduce the voltage drop along each segment. This kind of arrangement is particularly suitable for high-voltage photovoltaic cells, such as multifunction cells with concentration.

BRIEF DESCRIPTION OF THE DRAWINGS

The invention will now be described in more detail and with reference to the appended drawings, which show one embodiment of the invention by way of non-limiting example.

FIG. 1 is a diagrammatic representation of a prior art solar panel;

FIG. 2 is a diagrammatic representation of a panel according to the invention;

FIG. 3 is a diagrammatic representation of the rear wiring of the panel according to the invention;

FIG. 4 is a diagrammatic representation of the current loops in the panel according to the invention;

FIG. 5 is a diagrammatic representation of a first arrangement of cells with two interlaced serpentines and reversal of the direction of the current starting from the first two segments;

FIG. 6 is a diagrammatic representation of a second arrangement of cells with three interlaced serpentines and reversal of the direction of the current starting from the first pair of segments;

FIG. 7 is a diagrammatic representation of the arrangement of the cable pairs of the panel according to the invention;

FIG. 8 is a diagrammatic representation of a panel comprising two sections;

FIG. 9 is a diagrammatic representation of a panel comprising two modules.

DETAILED DESCRIPTION OF THE INVENTION

FIG. 1 shows a prior art plane solar panel PA which is substantially rectangular and in which square or rectangular photovoltaic cells CP are disposed alongside each other to form substantially a grid. Electrically connecting the cells of this kind of panel in series two by two in a serpentine SE1 is known in the art, the serpentine consisting of a plurality of segments of cells connected two by two in series. The segments are parallel to each other and disposed perpendicularly to an axis AX of the panel, two successive segments SG being connected at one of their ends. A serpentine therefore comprises a plurality of strings of cells, here forming U-shapes consisting of two segments of cells connected at their lower ends. Two successive strings are themselves connected in series by +, − electrical terminals at the upper ends of the U-shapes that they form. The upper ends of each U-shape are each connected to a positive terminal + or a negative terminal − of the panel, so that the electrical current supplied by each string is collected by wiring (not shown) and conveyed in the direction of the satellite. This kind of panel is usually immersed in a magnetic field that is oriented in the plane of the panel, which generates a torque due to the magnetic moment created by each current loop, as a result of Laplace forces. To cancel out the magnetic moment applied to the panel as a whole, two successive U-shapes form equal and opposite current loops so that the magnetic moment in respect of two successive current loops is zero. Thus the overall magnetic moment applied to the panel is zero for an even number of loops. In this prior art panel, two +, − terminals that are associated with the same U-shape are relatively close together and have a potential difference that is equal to the voltage drop of the whole of the corresponding string. Thus the maximum potential difference appears between successive terminals and between the two contiguous cells that are each at one end of the some U-shaped string. It follows that the short distance between the cells (or terminals), associated with a high potential difference, constitutes a risk of electrical arcing liable to short circuit a portion or the whole of the corresponding string.

To alleviate this drawback, the solar panel according to the invention shown in FIG. 2 is also rectangular with cells CP that are interconnected to form a serpentine SE1, but the positive + terminals and the negative − terminals are distributed along the serpentine and over the surface of the panel PA, instead of being disposed along the edge of the panel, as in the prior art. In this example of a panel according to the invention, the terminals are distributed along a diagonal of the panel, but other arrangements can also be envisaged, as will be explained later. In this panel according to the invention, the serpentine SE1 is made up of a plurality of cell segments SG connected in series and disposed parallel to each other, two successive segments SG having their ends connected. The various strings of cells of the serpentine are connected in series at positive or negative terminals distributed along the serpentine. Two successive strings have their cells arranged so that the current flows in opposite directions, so that a terminal connected to two successive strings collects the current from each of the two strings, as in the prior art panel shown in FIG. 1.

Alternatively, and to compensate the magnetic moment, the rear face of the panel according to the invention can comprise wiring adapted to convey the current available at the various terminals of the panel toward the axis AX. As can be seen in FIG. 3, this wiring comprises a plurality of cables CC, each cable leaving a terminal to join the axis AX by running along the segment of cells on which the terminal from which it runs is situated. Each cable then runs along the axis AX to form a bundle of cables FC and thereafter to be collected from the bundle FC by cable pairs that are not shown in FIG. 3. This kind of wiring compensates the magnetic moments by forming current loops in opposite directions that cancel each other out. The current loops BM+, BM− shown in FIG. 4 are each formed by two consecutive cell half-segments which have an interconnected end and by the corresponding portion of the bundle FC that runs along the axis AX. To be more specific, the cables CC that connect a terminal to the axis AX carry a current that flows in the opposite direction to the current flowing in the cells along which it runs, as can be seen in FIGS. 2 and 3. The current flowing in a cable CC is the same as that flowing in the cells along which it runs if the cable is connected to a terminal connected to only one string of cells, like the first or the last terminal of the serpentine. The current is doubled if the cable is connected to a terminal connected to two strings of cells, as can be seen in FIG. 3. The superposition of the current flowing in the cells and the current flowing in the cables thus forms the current loops BM+, BM− in opposite directions, with the result that the magnetic moments that they generate cancel each other out, as shown in FIG. 4. This variant of the panel according to the invention is adapted to increase the distance between terminals and cells at a high potential difference, whilst being subjected to a substantially zero global magnetic moment thanks to how its rear face is wired.

Another variant of the panel according to the invention comprises a plurality of interlaced serpentines of cells, to reduce further the potential difference of two contiguous cells. As shown in FIG. 5, the panel is made up of cell segments SG disposed parallel to each other to form a rectangular panel. The first serpentine SE1 is constituted of the first cell segment, which is connected to the third segment, which is in turn connected to the fifth segment, and so on, and the second serpentine SE2 is constituted of the second cell segment, which is connected to the fourth segment, and so on, so that two contiguous cell segments belong to two different serpentines. The direction of the current is reversed between the two serpentines, starting from the first two segments. In this panel, the maximum potential difference between two contiguous cells occurs at the cell situated at the lower or upper edge of the panel, but the serpentines are arranged symmetrically with respect to the axis AX of the panel. Accordingly, the potential difference between two cells situated at the edge of the panel is limited to the value of the voltage drop of one cell segment. To be more specific, the serpentine SE2 is obtained by considerations of axial symmetry with respect to the axis AX of the serpentine SE1 and then by translation along the axis AX by the length of a cell. The panel shown in FIGS. 2, 3 and 4, which comprises two serpentines SE1, SE2 could be equipped with rear face wiring for canceling out the global moment applied to the panel.

In another variant of interlacing, shown in FIG. 6, the panel comprises three interlaced serpentines SE1, SE2, SE3. In this variant, two serpentines SE1 and SE2 are disposed as in the FIG. 5 panel, but the serpentine SE2 is duplicated by the serpentine SE3 to obtain the benefit of the reduction of the voltage of two contiguous cells described above whilst increasing the surface area of the panel. Thus the serpentine SE2 is obtained by considerations of symmetry and translation of the serpentine SE1 and the serpentine SE3 is a replica of the serpentine SE2 translated along the axis AX by the length of a cell. As shown in the FIG. 6 example, the direction of the current in the first segment of the third serpentine SE3 is reversed relative to the direction of the current in the first segments of the two serpentines SE1 and SE2. It goes without saying that other variants can be envisaged, based upon the above model, for example to interlace four or five serpentines of cells in the some panel.

To recover the current produced by the strings of cells and to convey it toward the satellite, the panel can be equipped on its rear face with cable pairs, as shown in FIG. 7. The cable pairs PP, SP are constituted of flat cables C+, C− or cables mounted flat, such as ribbon cables. As can be seen in FIG. 7, the panel comprises first cable pairs PP that depart from the bundle FC and extend over a first half of the panel relative to the axis AX to reach an edge of the panel. Second cable pairs SP also depart from the bundle FC, but extend over a second half of the panel relative to the axis AX, and also join the edge of the panel. The first cable pairs and the second cable pairs have their polarities reversed to form current loops in opposite directions on either side of the axis, in order to cancel out the magnetic moments that they generate. To be more specific, the first cable pairs have a cumulative length that is substantially identical to the cumulative length of the second cable pairs, so that the magnetic moments generated on the first half of the panel and on the second half of the panel cancel each other out.

To use an odd number of cable pairs whilst generating a globally zero magnetic moment, the distances between the cables of each pair of cables could be modified, for example. Accordingly, for three cable pairs having the same length, by adjusting the two pairs with the same polarity and the same spacing, the third pair could compensate the first two by having the opposite polarity and twice the spacing. A similar arrangement could obviously suit all situations in which there is an odd number of cable pairs.

Alternatively, the panel according to the invention can comprise a plurality of electrically independent sections, to enable a management system of the satellite to manage the electrical power. As can be seen in FIG. 8, each section S1, S2 comprises at least one serpentine SE1, SE2 to form an electrically independent unit. The consecutive sections S1 and S2 are disposed along the axis AX, so that they have a common edge ZJ, along which there are side-by-side cells belonging to consecutive sections. If the management system disables one of the sections, all the cells of that section are at a zero potential, with the result that a high potential difference can occur between two cells on a common edge ZJ. To reduce the potential difference in this area, the segments of the common edge comprise a negative terminal; because a negative terminal is necessarily at a zero potential, the potential difference along the common edge ZJ is therefore reduced to the voltage drop of one segment SG. In the example shown in FIG. 8, the panel PA has two sections, but it goes without saying that this variant applies equally well to a panel comprising more than two sections.

Another variant of the panel according to the invention comprises a plurality of modules, each having at least one serpentine, to reduce the length of the segments of the panel to reduce the voltage drop between two ends of a segment. As can be seen in FIG. 9, the modules M1, M2 are then disposed facing each other, so that the ends of the segments SG that constitute their respective serpentines SE1, SE2 are contiguous. In the variant shown, there are disposed in the same panel PA two modules defining parallel axes AX, which halves the length of the segments SG. By disposing three modules in a similar fashion, the voltage drop of each segment SG is divided by three, for a substantially identical number of cells. This variant applies to high-yield cells, for example, for which the potential difference is greater than the potential difference of standard cells, which tends to increase the risk of electrical arcing. Moreover, as can be seen in FIG. 9, to reduce the potential difference of two contiguous cells that belong to different modules, the serpentines of each module are arranged symmetrically with respect to the axis defined by the junction area of the two modules M1 and M2. The potential difference of two contiguous cells belonging to two separate modules is therefore close to zero.

More generally, a solar panel can consist of a plurality of sections, for example, extending along a longitudinal axis AX, and each section can comprise a plurality of modules extending perpendicularly to the axis AX. That kind of solar panel is then constituted of a matrix of modules, each module comprising a plurality of cells interconnected in one or more serpentines.

The panel according to the invention therefore significantly reduces the risk of short circuiting of some portions of serpentines of cells, and in the various embodiments the global magnetic moment applied to the panel is substantially zero.

I claim:

1. A solar panel for space satellites, having a plane surface comprising a plurality of photovoltaic cells disposed side-by-side, said cells being electrically connected into plurality of serpentines, each serpentine comprising cells connected in series two-by-two forming parallel cell segments, two successive segments of a serpentine being electrically connected at their ends, and each serpentine comprising positive terminals (+) and negative terminals, said positive (+) and negative (−) terminals being distributed along each serpentine and over the surface of the panel so that the positive terminals are far enough away from the negative terminals, to reduce the risk of electrical arcing between two terminals; said panel comprising a plurality of serpentines interlaced and arranged substantially symmetrically with respect to an axis of the panel, said axis being perpendicular to said segments, and two contiguous segments of the panel belonging to two different serpentines, which solar panel is characterized in that the direction of the current is reversed starting from first pair of contiguous segments so that each pair of contiguous cells has a potential difference less than the voltage drop of a segment of cells, in order to reduce the risk of electrical arcing between contiguous cells.

2. The panel according to claim 1, comprising cables each departing from a terminal (+, −) of the panel and extending parallel to said segments as far as said axis of the panel and then running along said axis, forming a bundle of cables, to form with each serpentine current loops generating magnetic moments that cancel each other out.

3. The panel according to claim 2, comprising pairs of flat cables or cables mounted flat to recover a current supplied by the panel and direct it toward an edge of the panel, each cable pair comprising a positive cable and a negative cable, said pairs comprising first cable pairs departing from said bundle and extending over a first half of the panel relative to the axis and second cable pairs departing from the bundle and extending over a second half of the panel relative to the axis, and said first cable pairs having a cumulative length substantially identical to that of the second cable pairs to generate magnetic moments that cancel each other.

4. The solar panel according to claim 1, having at least two consecutive sections disposed along the axis, each section being electrically independent and comprising at least one serpentine constituted of a plurality of segments, wherein two contiguous segments belonging to two consecutive sections each comprises a negative terminal, so that two contiguous cells belonging to the two consecutive sections have a reduced potential difference if one of said two consecutive sections is electrically deactivated.

5. The solar panel according to claim 1, having at least two modules, each module comprising at least one serpentine constituted of segments and wherein two contiguous modules are disposed facing each other, so that the ends of their segments are contiguous, so that said segments have a reduced length in order to reduce the voltage drop along each segment.

* * * * *